United States Patent [19]

Gilley et al.

[11] Patent Number: 5,398,510
[45] Date of Patent: Mar. 21, 1995

[54] SUPERINSULATION PANEL WITH THERMOELECTRIC DEVICE AND METHOD

[75] Inventors: Michael D. Gilley, Rowlett; Lance Criscuolo, Dallas, both of Tex.; Ralph D. McGrath, Granville; Barry J. Arch, Toledo, both of Ohio

[73] Assignees: Marlow Industries, Inc., Dallas, Tex.; Owens-Corning Fiberglas Technology Corporation, Summit, Ill.

[21] Appl. No.: 180,456

[22] Filed: Jan. 12, 1994

[51] Int. Cl.$^6$ ............................................. F25B 21/02
[52] U.S. Cl. .......................................... 62/3.6; 62/3.2; 62/3.7
[58] Field of Search ................. 62/3.2, 3.7, 3.64, 3.4, 62/3.6

[56] References Cited

U.S. PATENT DOCUMENTS

| | | | |
|---|---|---|---|
| 2,837,899 | 6/1958 | Lindenblad | 62/1 |
| 2,872,788 | 2/1959 | Lindenblad | 62/3 |
| 2,932,953 | 4/1960 | Becket et al. | 62/3 |
| 3,177,670 | 4/1965 | Boehmer et al. | 62/3 |
| 3,177,671 | 4/1965 | Stambaugh | 62/3 |
| 3,280,573 | 10/1966 | Brown et al. | 62/3 |
| 3,823,567 | 7/1974 | Corini | 62/3 |
| 4,088,183 | 5/1978 | Anzai et al. | 165/104 |
| 4,203,487 | 5/1980 | Gartner | 165/50 |
| 4,290,416 | 9/1981 | Maloney | 126/430 |
| 4,326,383 | 4/1982 | Reed et al. | 62/3 |
| 4,328,676 | 5/1982 | Reed | 62/3 |
| 4,346,562 | 8/1982 | Beitner | 62/3 |
| 4,609,036 | 9/1986 | Schrader | 165/10 |
| 4,644,753 | 2/1987 | Burke | 62/3.6 |
| 4,662,180 | 5/1987 | Menocal | 62/3 |
| 4,726,193 | 2/1988 | Burke et al. | 62/3 |
| 5,007,226 | 4/1991 | Nelson | 52/809 |
| 5,018,328 | 5/1991 | Cur et al. | 50/406 |
| 5,082,335 | 1/1992 | Cur et al. | 312/401 |
| 5,090,981 | 2/1992 | Rusek, Jr. | 65/4.4 |
| 5,094,899 | 3/1992 | Rusek, Jr. | 428/69 |
| 5,099,649 | 3/1992 | Zorn | 62/3.6 |
| 5,157,893 | 10/1992 | Benson et al. | 52/792 |
| 5,168,339 | 12/1992 | Yokotani et al. | 257/64 |
| 5,209,069 | 5/1993 | Newman | 62/3.64 |
| 5,252,408 | 10/1993 | Bridges et al. | 428/621 |
| 5,330,816 | 7/1994 | Rusek, Jr. | 428/69 |

FOREIGN PATENT DOCUMENTS

| | | | |
|---|---|---|---|
| 0342165 | 11/1989 | European Pat. Off. | F25B 21/02 |
| 1125957 | 6/1960 | Germany . | |
| 1198837 | 8/1965 | Germany . | |
| 3-20580 | 1/1991 | Japan . | |
| 8101739 | 6/1981 | WIPO | F25B 21/02 |
| 8504948 | 11/1985 | WIPO | F25B 21/02 |

OTHER PUBLICATIONS

"A New Scientific Development in Refrigeration" *Electric & Gas Technology, Inc.*

*Primary Examiner*—John M. Sollecito
*Attorney, Agent, or Firm*—Baker & Botts

[57] ABSTRACT

A superinsulation panel and thermoelectric assembly are provided to maintain the temperature within a refrigerator or other type of enclosed structure at a desired value. The thermoelectric assembly includes a thermoelectric device having a hot sink and a cold sink. The superinsulation panel is preferably disposed between the hot sink and the cold sink. A cold finger is positioned within the superinsulation panel to transfer heat energy from the cold sink to the thermoelectric device which in turn transfers the heat energy to the hot sink. A plurality of posts may also be disposed within the superinsulation panel for use in coupling the thermoelectric assembly with the superinsulation panel.

20 Claims, 1 Drawing Sheet

SUPERINSULATION PANEL WITH THERMOELECTRIC DEVICE AND METHOD

RELATED APPLICATIONS

This application is related to co-pending patent application Ser. No. 08/180,887 filed on Jan. 12, 1994, entitled Thermoelectric Refrigerator; co-pending patent application Ser. No. 08/180,879 filed on Jan. 12, 1994, entitled Enclosure for Thermoelectric Refrigerator and Method; and co-pending patent application Ser. No. 08/180,888 filed Jan. 12, 1994, entitled Control System for Thermoelectric Refrigerator and Method.

1. Technical Field of the Invention

This invention relates to thermoelectric devices and more particularly to a superinsulation panel with thermoelectric device.

2. Background of the Invention

The basic theory and operation of thermoelectric devices has been developed for many years. Modern thermoelectric devices typically include an array of thermocouples which operate by using the Peltier effect. Thermoelectric devices are essentially small heat pumps which follow the laws of thermodynamics in the same manner as mechanical heat pumps, refrigerators, or any other apparatus used to transfer heat energy. The principal difference is that thermoelectric devices function with solid state electrical components (thermocouples) as compared to more traditional mechanical/fluid heating and cooling components.

When direct current (DC) electrical power is applied to a thermoelectric device having an array of thermocouples, heat is absorbed on the cold side of the thermocouples and passes through the thermocouples and is dissipated on the hot side of the thermocouples. A heat sink (sometimes referred to as the "hot sink") is preferably attached to the hot side of the thermoelectric device to aid in dissipating heat from the thermocouples to the adjacent environment. In a similar manner a heat sink (sometimes referred to as a "cold sink") is often attached to the cold side of the thermoelectric device to aid in removing heat from the adjacent environment. Thermoelectric devices are sometimes referred to as thermoelectric coolers; however, since they are a type of heat pump, thermoelectric devices can function as either a cooler or a heater.

There are a wide variety of containers and enclosed structures which are designed to be maintained within a selected temperature range. Examples of such containers and enclosed structures include, but are not limited to, refrigerators, picnic coolers, cabinets containing sensitive electronic equipment, and organ transplant containers. The use of thermoelectric devices which operate on a DC voltage system are well known to maintain desired operating temperatures in refrigerators and portable coolers. An example of a container having a thermoelectric cooler is shown in U.S. Pat. No. 4,726,193 entitled Temperature Controlled Picnic Box. Examples of refrigerators which function with a thermoelectric device are shown in U.S. Pat. No. 2,837,899, entitled Thermoelectric Refrigerator; U.S. Pat. No. 3,177,670, entitled Thermoelectric Refrigerator; and U.S. Pat. No. 3,280,573 entitled Refrigerator-Package Arrangement. U.S. Pat. No. 5,168,339, entitled Thermoelectric Semiconductor Having A Porous Structure Deaerated in a Vacuum and Thermoelectric Panel Using P-Type and N-Type Thermoelectric Semiconductors, discloses an electronic refrigeration panel.

Conventional refrigerators typically consist of an insulated enclosure with a centralized cooling system based on the vapor compression cycle of fluorinated hydrocarbons (FREON ®) or other types of hydrocarbons. The cooling system usually has greater cooling capacity than the actual heat load which results in the cooling system acting intermittently in a binary duty cycle—either on or off. This binary duty cycle results in temperature variations as the refrigerator warms up while the compressor is off and cools down when the compressor is running. Thus the temperature in a typical refrigerator is not steady, but cycles between an upper limit and a lower limit.

Presently available cooling systems frequently include an air/evaporator interface which requires a relatively high air flow rate to obtain the best cooling efficiency and to prevent frost or ice from forming on the evaporator. This air flow rate is often in excess of the air velocities required to cool the interior of the refrigerator and results in further system inefficiencies.

Vapor compression cooling systems frequently use CFCs (chloro-fluorocarbons) such as FREON ® as the working fluid. The negative effects of CFCs on the environment are well known and there exists both national and international regulations to ban the use of such CFCs. Other fluorocarbons such as HCFCs and HFCs have their own limitations and problems for use in refrigeration systems.

SUMMARY OF THE INVENTION

In accordance with the present invention, disadvantages and problems associated with previous thermoelectric refrigerators used to maintain selected temperatures within such refrigerators have been substantially reduced or eliminated. The present invention provides an efficient, non-fluorocarbon cooling system that is both environmentally safe and energy efficient.

A superinsulation panel including a thermoelectric assembly having a thermoelectric device along with two associated heat sinks (sometimes referred to as the hot sink and the cold sink) are provided for installment in a container or enclosed structure such as a refrigerator. The thermoelectric device and the hot sink are preferably disposed on one side of the superinsulation panel. The cold sink is preferably disposed on the opposite side of the superinsulation panel. A cold finger is positioned within the superinsulation panel between the thermoelectric device and the attached hot sink on the one side and the cold sink on the opposite side of the superinsulation panel. One or more posts may be disposed within the superinsulation panel for use in mounting the hot sink, the cold sink and the associated thermoelectric device on the exterior of the superinsulation panel with the cold finger disposed therebetween.

A significant technical advantage of the present invention includes that the superinsulation panel and attached thermoelectric assembly may be used to provide cooling for a wide variety of containers, boxes and other types of enclosed structures.

A further significant technical advantage of the present invention includes eliminating or substantially reducing the number of openings required to mount a cooling system on an enclosed structure and to remove heat from within the enclosed structure. If desired, a cold finger may be placed within a superinsulation panel to allow heat transfer through the panel without forming any openings in the panel.

BRIEF DESCRIPTION OF THE DRAWINGS

For a more complete understanding of the present invention, and the advantages thereof, reference is now made to the following written description taken in conjunction with the accompanying drawings, in which.

DETAILED DESCRIPTION OF THE INVENTION

Figure 1:
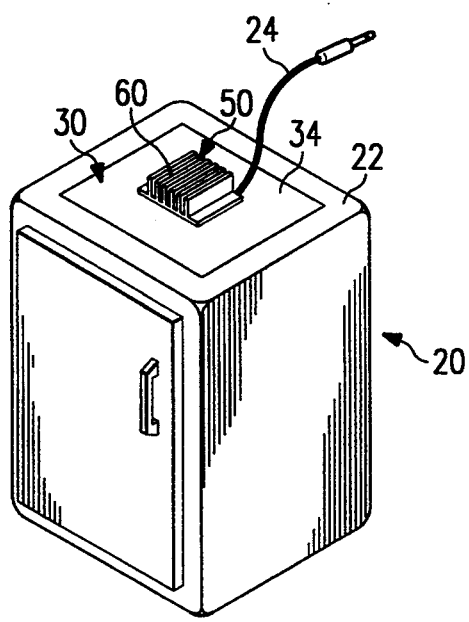
FIG. 1 is an isometric drawing of a refrigerator or enclosed structure having a superinsulation panel with a thermoelectric assembly incorporating an aspect of the present invention.
Figure 2:
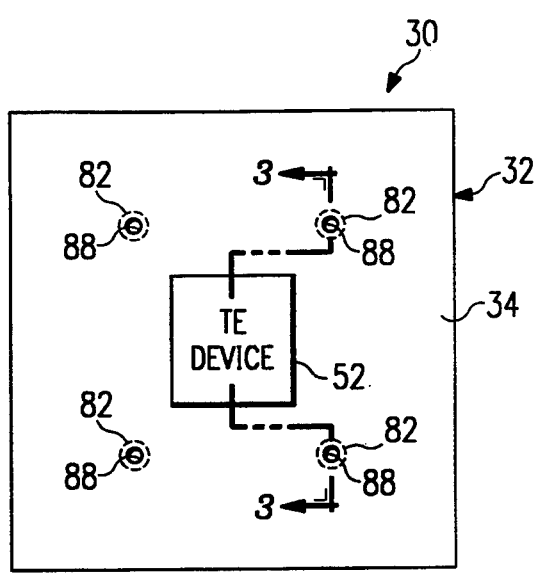
FIG. 2 is a schematic plan view of the superinsulation panel of FIG. 1 with portions of the thermoelectric assembly broken away.
Figure 3:
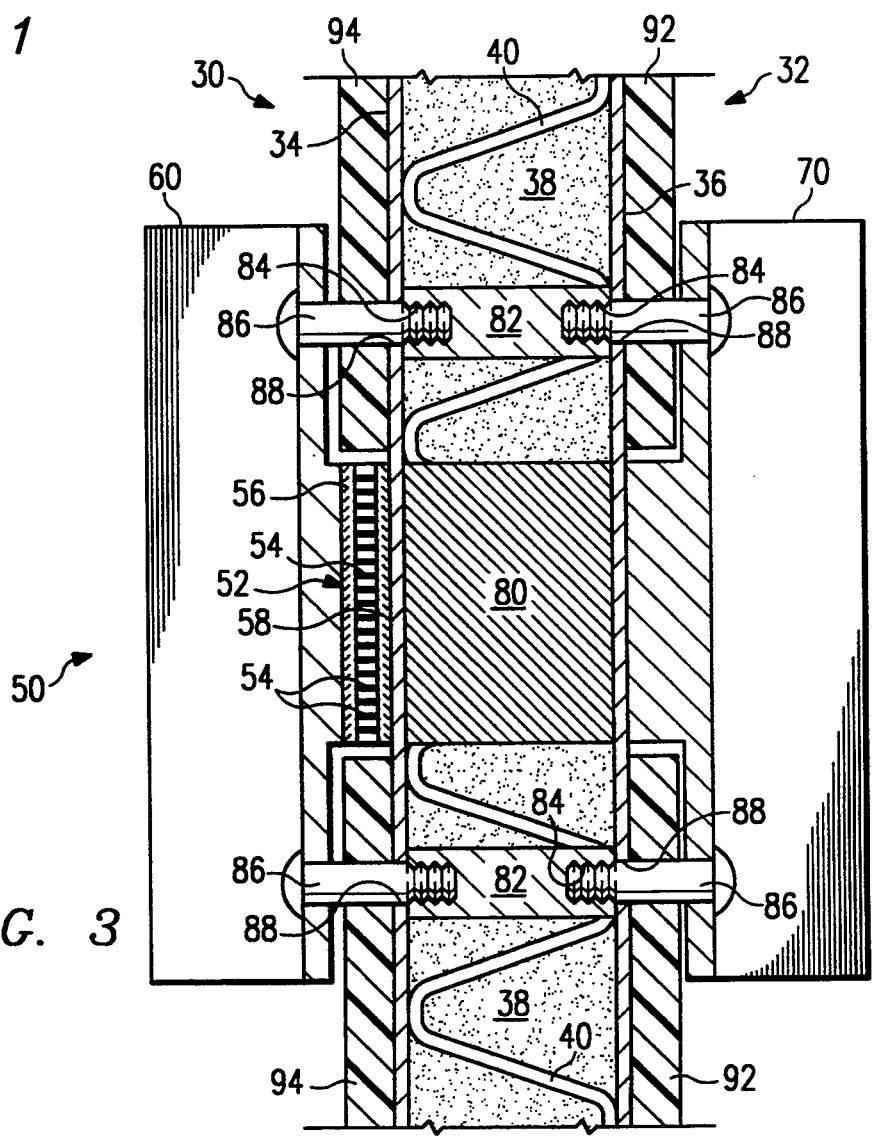
FIG. 3 is an enlarged drawing in section with portions broken away taken along line 3—3 of FIG. 2.

The preferred embodiments of the present invention and its advantages are best understood by referring to FIGS. 1 through 3 of the drawings, like numerals being used for like and corresponding parts of the various drawings.

As shown in FIG. 1, refrigerator or enclosure structure 20 includes superinsulation panel 30 with thermoelectric assembly 50 mounted thereon. For purposes of illustration, superinsulation panel 30 with thermoelectric assembly 50 is shown installed in top portion 22 of refrigerator 20. If desired, superinsulation panel 30 with thermoelectric assembly 50 may also be installed in the sides, back, door assembly or bottom of refrigerator 20. The location of superinsulation panel 30 and its associated thermoelectric assembly 50 may be varied to provide the optimum performance with respect to the specific use for refrigerator 20. Superinsulation panel 30 and thermoelectric assembly 50 may also be used with various types of enclosures such as a cabinet for electronic equipment, pharmaceutical storage, organ transplant containers, etc. A superinsulation panel with a thermoelectric assembly incorporating the present invention are not limited to use with refrigerators and freezers.

For purposes of this patent application, the term "superinsulation panel" is used generally to refer to insulating material having an R-value per inch (resistance to the transfer of thermal energy) greater than approximately twenty (R20/inch). Insulation performance is often measured by use of "R" values, where R is a thermal resistivity, and higher R-values indicate better insulating performance. R-value/inch is used to compare the thermal performance of different insulating materials. For example, fiberglass has an R-value/inch of about 3.2 hr-ft$^2$-F/BTU, while styrene foam has an R-value/in. of about 5 hr-ft$^2$-F/BTU.

Various types of superinsulation panels may be satisfactorily used with the present invention. Examples of such superinsulation panels which have a high R-value are shown in U.S. Pat. No. 5,090,981 entitled Method for Making High R Superinsulation Panel, and U.S. Pat. No. 5,094,899 entitled High R Superinsulation Panel. A preferred superinsulation panel is set forth in pending U.S. patent application Ser. No. 07/993,883, filed Dec. 23, 1992 now U.S. Pat. No. 5,330,816. All of these patents are incorporated by reference for all purposes within this application. Such superinsulation panels are available from Owens-Corning Fiberglas Corporation located in Toledo, Ohio. Owens-Corning uses the trademark "AURA" with respect to such superinsulation panels. Superinsulation panels may be used to form the side walls, bottom wall, door assembly, and/or top wall or portions thereof for refrigerator 20.

Superinsulation panel 30 is shown in FIGS. 1 and 2 as having a generally square configuration. However, superinsulation panels having rectangular, oval, circular, or any other geometric configuration may be satisfactorily used with the present invention. Superinsulation panel 30 preferably comprises a sealed envelope 32 having a first wall 34 and a second wall 36. Various types of filler material or insulating material 38 and supporting structures 40 may be disposed within envelope 32 between walls 34 and 36. Envelope 32 is typically sealed around the edges of walls 34 and 36 to allow a vacuum to be maintained within envelope 32. For some applications, envelope 32 of superinsulation panel 30 may be evacuated to a vacuum between $10^{-4}$ Torr and 10 Torr. Envelope 32 is preferably formed from gas impervious material.

Numerous materials may be used as insulating or filler material 38. U.S. Pat. Nos. 5,090,981 and 5,094,899 teach the use of mineral fiber board and particulate matter packed in the interstices of the fiberboard to perform the functions of filler material 38 and supporting structure 40. U.S. Pat. No. 5,157,893 entitled Compact Vacuum Insulation teaches the use of spherically shaped glass or ceramic beads which function as filler material 38 and continuous sheets of metal which function as supporting structure 40. U.S. Pat. No. 5,252,408 entitled Vacuum Insulated Panel and Method of Forming a Vacuum Insulated Panel, teaches the use of a compressed block of particulate charcoal, activated carbon black, silica gel or other appropriate mixtures to perform the function of filler material 38 and supporting structure 40. U.S. Pat. No. 5,082,335 entitled Vacuum Insulation System for Insulating Refrigerator Cabinets, teaches the use of a vacuum insulation panel having multiple sealed compartments containing microporous filler insulation material. Each of these above-referenced patents are incorporated by reference for all purposes within this application.

Referring to FIG. 3, during the assembly of superinsulation panel 30, block 80 is positioned within envelope 32 between walls 34 and 36. Block 80 is preferably formed from material such as copper having high thermal conductivity. As will be described in more detail, block 80 functions as a thermal short to allow the transfer of thermal energy through superinsulation panel 30. Block 80 may also be referred to as a "cold finger."

A plurality of posts or anchors 82 may be used for mounting thermoelectric assembly 50 and are preferably disposed within envelope 32 between walls 34 and 36. Threaded openings 84 are provided at each end of each post 82 to provide a portion of the means for mounting thermoelectric assembly 50 with superinsulation panel 30. A hermetic seal (not shown) is preferably formed between the end of each post 82 and the adjacent portion of walls 34 and 36 to assist with maintaining the desired vacuum within superinsulation panel 30.

For some applications, superinsulation panel 30 is preferably disposed between liners 92 and 94 adjacent to walls 32 and 34 respectively. Liners 92 and 94 may be formed from fiberglass reinforced plastic or other suitable materials to provide dimensional stability and rigidity for associated superinsulation panel 30. For the embodiment of the present invention represented by FIGS.

1 and 3, wall 34 and liner 94 represent the exterior of refrigerator 20 and wall 36, and liner 9 represents the interior of refrigerator 20.

Thermoelectric assembly 50 includes thermoelectric device 52 with first heat sink 60 and second heat sink 70 disposed on opposite sides thereof. Thermoelectric device 52 preferably includes a plurality of thermocouples or thermoelectric elements 54 disposed between thermally conductive plates 56 and 58. For some applications, plates 56 and 58 may be formed from ceramic and/or composite materials as desired. Thermoelectric elements 54 may be selected from materials such as bismuth telluride to provide an array of P-N junctions with the desired thermoelectric characteristics to allow thermoelectric device 52 to function as a heat pump.

Thermoelectric elements 54 are preferably connected electrically in series and thermally in parallel. Conductor or electrical power cord 24 (FIG. 1) is provided to supply electrical energy such as from a 12 volt DC power supply (not shown). The power supply can be a battery, DC power generator, AC/DC converter, or any other appropriate source of DC electrical power. When DC electrical power is supplied to thermoelectric device 52, heat is absorbed on the cold side represented by plate 58 and passes through thermoelectric elements or thermocouples 54 and is dissipated on the hot side at plate 56.

The efficiency of thermoelectric device 52 may be substantially improved by attaching first heat sink 60 to hot plate 56. Cold finger 80 is positioned within superinsulation panel 30 to thermally connect cold sink 70 with cold plate 58. Various types of bonding techniques and mounting procedures may be used to secure first heat sink 60 and thermoelectric device 52 with wall 34 of superinsulation panel 30. In a similar manner various bonding techniques and mounting procedures may be used to attach second heat sink 70 with wall 36 of superinsulation panel 30. For some applications, thermally conductive epoxy compounds and glue may be satisfactorily used to couple thermoelectric assembly 50 with superinsulation panel 30. For other applications, thermal grease or indium foil may be satisfactorily used to couple thermoelectric assembly 50 with superinsulation panel 30.

Heat sinks 60 and 70 are shown as fin type heat exchangers which may be extruded as a single unit from appropriate material such as aluminum or copper. Heat sinks 60 and 70 could be manufactured from other types of material having the desired thermal conductivity and strength characteristics. In addition, other heat exchanger designs such as pin fin, slotted fin or fin welded heat sinks could be used in place of the single unit extruded heat sinks 60 and 70 shown in FIGS. 1 and 3.

As best shown in FIGS. 2 and 3, one embodiment of the present invention includes attaching thermoelectric assembly 50 to superinsulation panel 30 with a plurality of bolts 86 engaged with their respective posts 82. Posts 82 are preferably formed from material which has a high resistance to the transfer of thermal energy. Each end of each post 82 is preferably bonded with the adjacent portion of the respective walls 34 and 36. Such bonding is desired to form a seal (not shown) which maintains the vacuum within envelope 32. For purposes of better illustrating the invention, heat sink 60 has been removed in FIG. 2.

A plurality of openings 88 are formed in each wall 34 and 36 to correspond with the location of the associated post 82 and its respective threaded openings 84. Openings 88 and threaded openings 84 cooperate with each other to allow using bolts 86 to couple thermoelectric assembly 50 with superinsulation panel 30. Bolts 86 may be inserted through their respective openings 88 in walls 34 and 36 to secure heat sink 60 and thermoelectric device 52 with one side of superinsulation panel 30 and second heat sink 70 to the other side of superinsulation panel 30 with cold finger 80 sandwiched therebetween.

When DC electrical power is supplied to thermoelectric device 52, heat energy will flow from the interior of refrigerator 20 through heat sink 70 and cold finger 80 to conductive plate 58. The heat energy at conductive plate 58 is transferred by thermoelectric elements 54 to conductive plate 56 and dissipated or diffused to the exterior of refrigerator 20 by heat sink 60. If desired, air circulating means such as an electrical motor (not shown) with a propeller and/or impeller (not shown) may be positioned adjacent to heat sink 60 and/or heat sink 70 to assist with the circulation of air and the transfer of heat energy from the interior of refrigerator 20 to the exterior of refrigerator 20 through thermoelectric assembly 50. U.S. Pat. No. 4,726,193 entitled "Temperature Controlled Picnic Box" shows some examples of air circulating means used with a thermoelectric device and is incorporated by reference for all purposes in this application.

Thermoelectric assembly 50 may be mounted on the exterior of superinsulation panel 30 by using various types of adhesives, welding procedures and/or clamps as an alternative to bolts 86 and posts 82. The principal requirement in mounting thermoelectric assembly 50 on insulation panel 30 is to ensure that conductive plate 58 of thermoelectric device 52 and cold finger 80 are disposed adjacent to each other on opposite sides of wall 34. In a similar manner, heat sink 70 and cold finger 80 are preferably disposed adjacent to each other on opposite sides of wall 36. Various types of mounting procedures may be satisfactorily used as long as this relationship is maintained between thermoelectric device 52, cold finger 80 and heat sinks 60 and 70.

Although the present invention and its advantages have been described in detail, it should be understood that various changes, substitutions and alterations can be made without departing from the spirit and scope of the invention as defined by the following claims.

What is claimed is:

1. A superinsulation panel having a thermoelectric assembly mounted thereon for controlling the temperature within an enclosed structure comprising:

the superinsulation panel formed in part by an envelope having a first wall and a second wall;

a thermoelectric device with a first heat sink disposed on one side of the thermoelectric device and the other side of the thermoelectric device contacting the exterior of the first wall of the envelope;

a second heat sink contacting the exterior of the second wall; and a cold finger disposed within the envelope between the first wall and the second wall for use in transferring heat energy from the second heat sink to the thermoelectric device.

2. The superinsulation panel of claim 1 further comprising:

a plurality of posts, formed from material with a high resistance to thermal energy transfer, disposed within the envelope between the first wall and the second wall; and a plurality of bolts extending through the respective heat sinks and engaged with openings in associated posts for use in mounting the first heat sink and the second heat sink to the superinsulation panel.

3. The superinsulation panel as defined in claim 1 further comprising a vacuum panel filled with insulating material selected from the group consisting of mineral fiberboard, glass beads, and microporous filler material.

4. The superinsulation panel of claim 1 wherein the enclosed structure further comprises a refrigerator.

5. The superinsulation panel of claim 1 wherein the enclosed structure further comprises a refrigerator with the superinsulation panel installed on top of the refrigerator.

6. The superinsulation panel of claim 1 having an R-value per inch greater than approximately twenty (R20/inch).

7. The superinsulation panel of claim 1 further comprising the envelope formed from gas impervious material and a vacuum sealed within the envelope.

8. The superinsulation panel as defined in claim 1 further comprising a vacuum between $10^{-4}$ Torr and 10 Torr sealed within the envelope and mineral fiberboard disposed between the first wall and the second wall.

9. The superinsulation panel of claim 1 wherein the thermoelectric device is mounted on the first wall with an epoxy compound and the second heat sink is mounted on the second wall with an epoxy compound.

10. A thermoelectric assembly mounted on a superinsulation panel for controlling the temperature within an enclosed structure comprising:
the superinsulation panel formed in part by an envelope having a first wall and a second wall;
a thermoelectric device with a first heat sink disposed on one side of the thermoelectric device and the other side of the thermoelectric device contacting the exterior of the first wall of the envelope;
a second heat sink contacting the exterior of the second wall; and
a cold finger disposed within the envelope between the first wall and the second wall for use in transferring heat energy from the second heat sink to the thermoelectric device.

11. The thermoelectric assembly of claim 10 further comprising:
a plurality of posts, formed from thermally non-conductive material, disposed within the envelope between the first wall and the second wall; and
a plurality of bolts extending through the respective heat sinks and engaged with openings in associated posts for use in mounting the first heat sink and the second heat sink to the superinsulation panel.

12. The thermoelectric assembly of claim 10 wherein the superinsulation panel further comprises a vacuum panel filled with insulating material selected from the group consisting of mineral fiberboard, glass beads, and microporous filler material.

13. The thermoelectric assembly of claim 10 further comprising a first liner disposed adjacent to the first wall and a second liner disposed adjacent to the second wall.

14. The thermoelectric assembly of claim 10 wherein the enclosed structure further comprises a refrigerator with the superinsulation panel installed on top of the refrigerator.

15. The thermoelectric assembly of claim 10 with the superinsulation panel having an R-value per inch greater than approximately twenty (R20/inch).

16. The thermoelectric assembly of claim 10 further comprising the envelope formed from gas impervious material and a vacuum sealed within the envelope.

17. The thermoelectric assembly as defined in claim 10 further comprising a vacuum between $10^{-4}$ Torr and 10 Torr sealed within the envelope and mineral fiberboard disposed between the first wall and the second wall.

18. The method of coupling a thermoelectric assembly with a superinsulation panel comprising the steps of:
forming the superinsulation panel from a gas-tight envelope having a first wall and a second wall;
placing a cold finger within the envelope between the first wall and the second wall;
mounting a thermoelectric device on the exterior of the first wall adjacent to the cold finger with a first heat sink attached to the thermoelectric device opposite from the cold finger; and
mounting a second heat sink on the second wall adjacent to the cold finger.

19. The method of claim 18 further comprising the steps of:
installing a plurality of posts within the superinsulation panel between the first wall and the second wall; and
inserting a plurality of bolts through the first heat sink and the second heat sink to engage threaded openings in associated posts for coupling the thermoelectric assembly with the superinsulation panel.

20. The method of claim 18 further comprising the steps of:
positioning the thermoelectric device adjacent to the cold finger with the first wall disposed therebetween and the first heat exchanger extending from the thermoelectric device opposite from the cold finger; and
mounting the second heat exchanger adjacent to the cold finger with the second wall disposed therebetween.

* * * * *